(12) United States Patent
Doan

(10) Patent No.: US 6,743,699 B1
(45) Date of Patent: Jun. 1, 2004

(54) METHOD OF FABRICATING SEMICONDUCTOR COMPONENTS

(75) Inventor: Trung Tri Doan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/349,220

(22) Filed: Jan. 21, 2003

(51) Int. Cl.⁷ ............................................. H01L 21/301
(52) U.S. Cl. ...................... 438/460; 438/462; 438/463; 438/465; 438/113; 438/114; 438/780
(58) Field of Search ................... 438/780, 748, 438/612, 106, 113, 114, 460, 462, 463, 464, 465

(56) References Cited

U.S. PATENT DOCUMENTS

| | | | | |
|---|---|---|---|---|
| 5,494,549 A | * | 2/1996 | Oki et al. ................ | 156/268 |
| 5,824,595 A | * | 10/1998 | Igel et al. ................ | 438/464 |
| 5,888,883 A | * | 3/1999 | Sasaki et al. ............ | 438/460 |
| 5,904,548 A | * | 5/1999 | Orcutt ..................... | 438/462 |
| 5,972,781 A | * | 10/1999 | Wegleiter et al. ....... | 438/460 |
| 6,117,347 A | * | 9/2000 | Ishida ..................... | 216/52 |
| 6,184,109 B1 | * | 2/2001 | Sasaki et al. ............ | 438/464 |
| 6,399,464 B1 | * | 6/2002 | Muntifering et al. .... | 438/465 |
| 6,406,979 B2 | * | 6/2002 | Fischer et al. .......... | 438/460 |
| 6,420,245 B1 | * | 7/2002 | Manor ..................... | 438/460 |
| 6,555,447 B2 | * | 4/2003 | Weishauss et al. ...... | 438/460 |
| 6,642,127 B2 | * | 11/2003 | Kumar et al. ........... | 438/460 |
| 2002/0013061 A1 | * | 1/2002 | Siniaguine et al. ...... | 438/706 |

OTHER PUBLICATIONS

U.S. patent application Ser. No. 10/094,161, Farnworth et al., filed Mar. 6, 2002.
U.S. patent application Ser. No. 10/191,424, Farnworth et al., filed Jul. 8, 2002.

* cited by examiner

Primary Examiner—Matthew Smith
Assistant Examiner—B V Keshavan
(74) Attorney, Agent, or Firm—Wells St. John P.S.

(57) ABSTRACT

A plurality of semiconductor dice are provided on a substrate having a first side and a second side, with the semiconductor dice being spaced from one another by scribe line area. A stencil is positioned over at least one of the first side and the second side of the substrate. The stencil has masking sections which cover at least portions of the scribe line area. A polymer is applied through the positioned stencil onto the first or second side of the substrate over which the stencil is received, with the stencil substantially precluding the polymer from being applied on the covered portions of the scribe line area. After the applying, portions of the scribe line area are cut into and the plurality of dice are singulated from the substrate. Other aspects and implementations are contemplated.

44 Claims, 6 Drawing Sheets

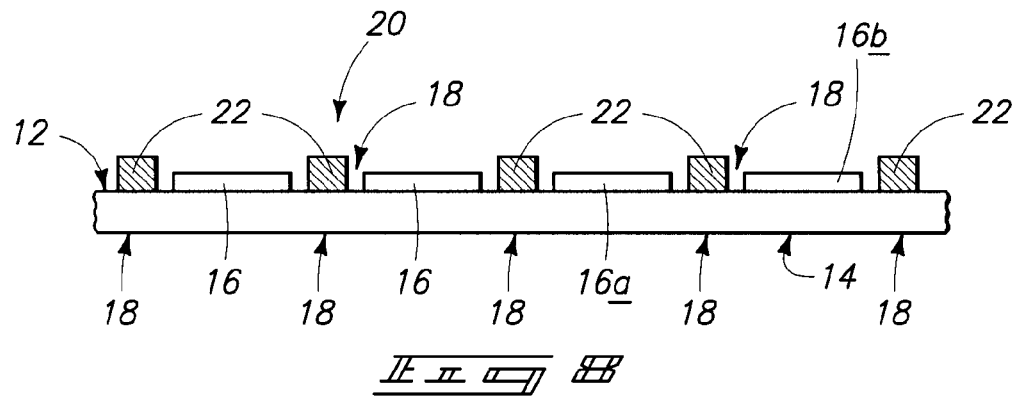
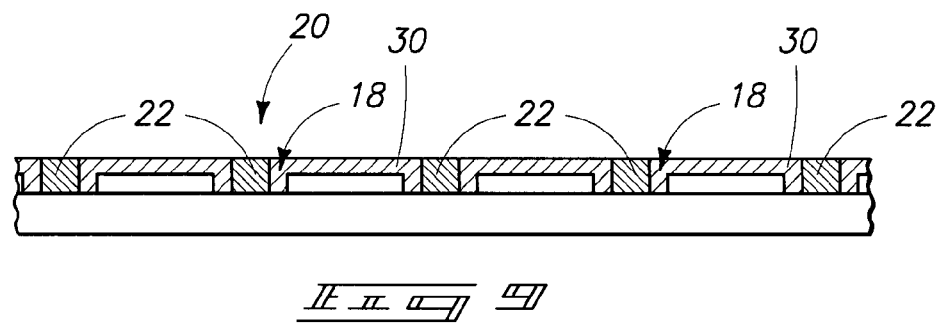
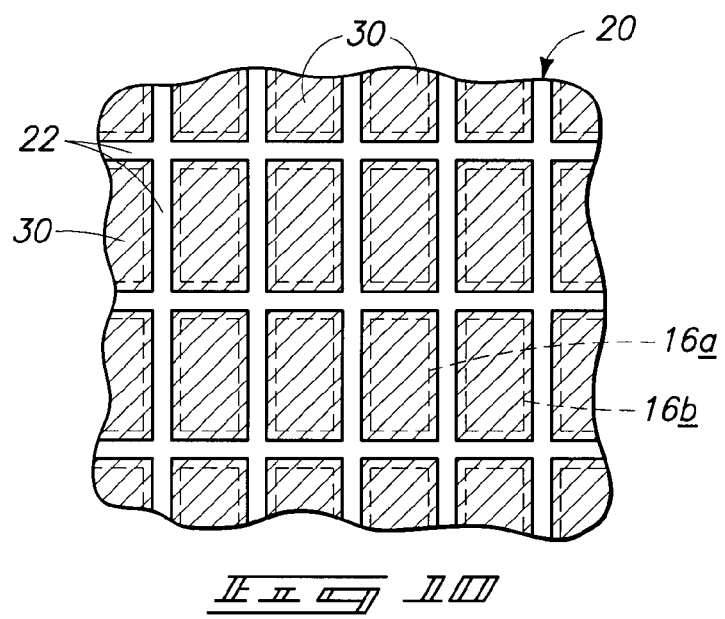

METHOD OF FABRICATING SEMICONDUCTOR COMPONENTS

TECHNICAL FIELD

This invention relates to methods of fabricating semiconductor components.

BACKGROUND OF THE INVENTION

Integrated circuits are typically formed on a semiconductor substrate such as a silicon wafer or another semiconducting material. In general, layers of various materials which are either semiconducting, conducting or insulating are utilized to form the integrated circuits, typically on only one side of the substrate. By way of example, the various materials are doped, deposited and etched using various processes.

Each wafer is processed to include a large number of semiconductor dice or chips. The semiconductor dice are identifiable and spaced from one another by scribe line area or street area. "Scribe line area" and "street line area" are used synonymously herein, and such are typically areas on the substrate within which no circuitry is fabricated. Alternately by way of example only, such scribe line area might include some circuitry (i.e., test circuitry or burn-in circuitry).

Following circuitry fabrication, the wafer is diced or singulated to separate the individual dice from one another for packaging or for use in an unpackaged form. The present two main techniques for wafer cutting are scribing and sawing. With typical scribing, a diamond tip scribe is moved across the surface of the wafer along the street area. The diamond scribe forms shallow scratches on the wafer surface. Other scribing methods can of course be used, for example scribing with a laser or fluid such as water. Upon the application of pressure to the scribed wafer, such as with a roller, the wafer separates along the scribe lines. The breaks in the wafer typically follow the crystal lattice structure of the wafer substrate. Scribing is typically used for wafers about 10 mils or less in thickness.

For thicker wafers, cutting by sawing is presently the preferred method for dicing, although cutting by scribing can also be used. With one typical type of sawing, a diamond-tipped mechanical saw rotating at high rpms contacts and saws the wafer along the scribe line area. Other techniques can of course be used, for example cutting with a laser or fluid such as water. Regardless, cutting/sawing can be partially or completely through the wafer. Typically, and especially with saw cutting, the wafer is mounted on a supporting member such as an elastomeric adhesive film stretched across a film frame. Upon singulation, the singulated dice remain adhering to the elastomeric adhesive film and are ultimately removed therefrom. Then, the individual dice are typically encapsulated in a suitable protecting plastic polymer film, and wired appropriately.

Recently, fabrication techniques have been proposed and used which provide at least some degree of protective polymer encapsulation of the dice prior to their singulation from the wafer. This is commonly referred to as wafer scale integration or fabrication. Exemplary techniques include the application of the finishing or protecting polymer over the front and back sides of the substrate, then dicing the substrate by cutting through the polymer and substrate. In another method, partial cuts are made into the scribe line area, and then subsequently filled with the protective polymer. When using a mechanical saw, a thinner/narrower saw is then used to cut through the polymer within the previous saw cuts, and through uncut portions of the substrate therebeneath, for singulating the dice from the wafer. In either such events, the mechanical saw cuts through the polymer material which unfortunately can adhere to and foul the saw. This can require considerable undesirable periodic cleaning of the saw blades to achieve the desired dicing effect from wafer to wafer.

The invention was motivated in addressing the above issues and improving upon the above-described drawbacks. However, it is in no way so limited. The invention is only limited by the accompanying claims as literally worded (without interpretative or other limiting reference to the above background art description, remaining portions of the specification or the drawings) and in accordance with the doctrine of equivalents.

SUMMARY

The invention includes methods of fabricating semiconductor components. In one implementation, a plurality of semiconductor dice are provided on a substrate having a first side and a second side, with the semiconductor dice being spaced from one another by scribe line area. A stencil is positioned over at least one of the first side and the second side of the substrate. The stencil has masking sections which cover at least portions of the scribe line area. A polymer is applied through the positioned stencil onto the first or second side of the substrate over which the stencil is received, with the stencil substantially precluding the polymer from being applied on the covered portions of the scribe line area. After the applying, portions of the scribe line area are cut into and the plurality of dice are singulated from the substrate.

In one implementation, a method of fabricating semiconductor components includes providing a plurality of semiconductor dice on a substrate having a first side and a second side. The semiconductor dice are spaced from one another by scribe line area. A stencil is positioned over the first side of the substrate. The stencil has masking sections which cover at least portions of the scribe line area. The stencil also has at least one alignment mark. A polymer is applied through the first-side positioned stencil onto the first side of the substrate, with the stencil substantially precluding the polymer from being applied on the covered portions of the scribe line area on the first side. At least one alignment mark is formed on the first side polymer with the at least one stencil alignment mark. After applying the polymer onto the first side of the substrate, the stencil is positioned over the second side of the substrate in a manner that aligns all stencil alignment marks with all first side polymer alignment marks. A polymer is applied through the second-side positioned stencil onto the second side of the substrate, with the stencil substantially precluding the polymer from being applied on the covered portions of the scribe line area on the second side. After applying the polymer onto the second side of the substrate, the stencil is removed from the second side and portions of the scribe line area are cut into and the plurality of dice are singulated from the substrate.

Other aspects and implementations are contemplated.

BRIEF DESCRIPTION OF THE DRAWINGS

Preferred embodiments of the invention are described below with reference to the following accompanying drawings.

FIG. 8 is an enlarged diagrammatic sectional view taken through lines 8—8 in FIG. 4.

FIG. 9 is a view of the FIG. 8 substrate at a processing step subsequent to that shown by FIG. 8.

FIG. 10 is a FIG. 4 scale top view of the FIG. 9 substrate.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Exemplary embodiments of methods of fabricating semiconductor components in accordance with exemplary preferred implementations are described with reference to FIGS. 1–16. As used herein, the term "semiconductor component" refers to any electronic element that includes a semiconductor die. By way of example only, exemplary semiconductor components include semiconductor packages, semiconductor dice, ball grid array devices, flip chips, bumped dice, direct die contact packages, etc.

Figure 1:
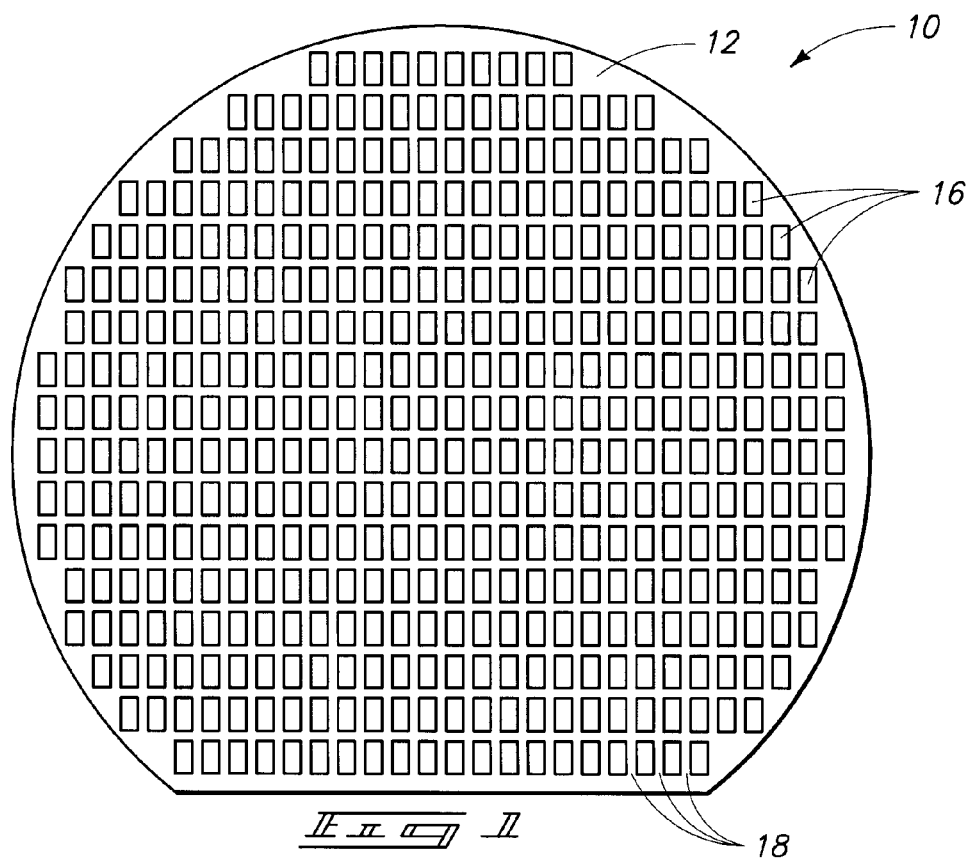
FIG. 1 is a diagrammatic top plan view of a semiconductor wafer prior to dicing.
Figure 2:
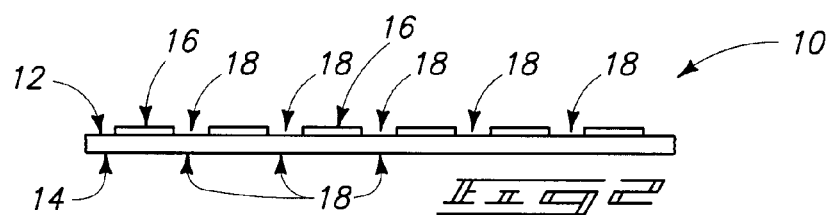
FIG. 2 is an enlarged side/sectional view of a portion of the FIG. 1 wafer.

FIGS. 1 and 2 depict a semiconductor substrate or wafer 10 which includes a first side 12 and a second side 14. A plurality of semiconductor dice 16 have been fabricated on the substrate, principally relative to first side 12 as shown. Individual semiconductor dice 16 are separated or spaced from one another by scribe line/street area 18. Any of the processing described below can occur to either or both sides of the depicted or other substrate. Further where processing as described below applies to both sides of the substrate, such could occur in any order.

Figure 3:
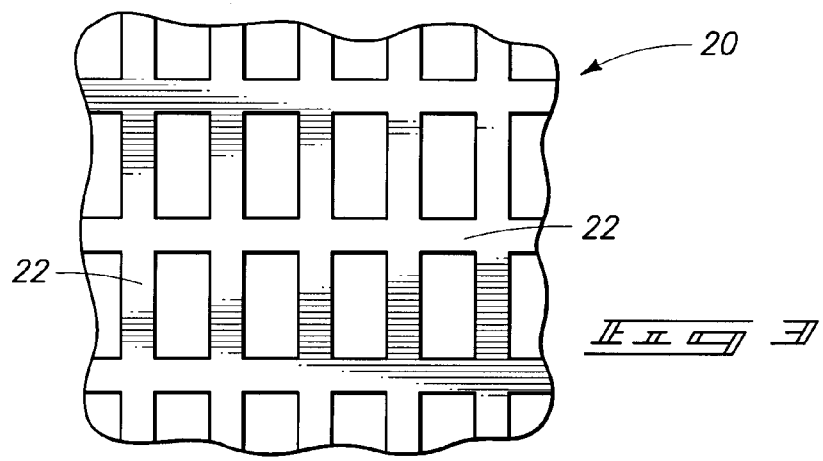
FIG. 3 is an enlarged top view of a stencil usable in accordance with an aspect of the invention.
Figure 4:
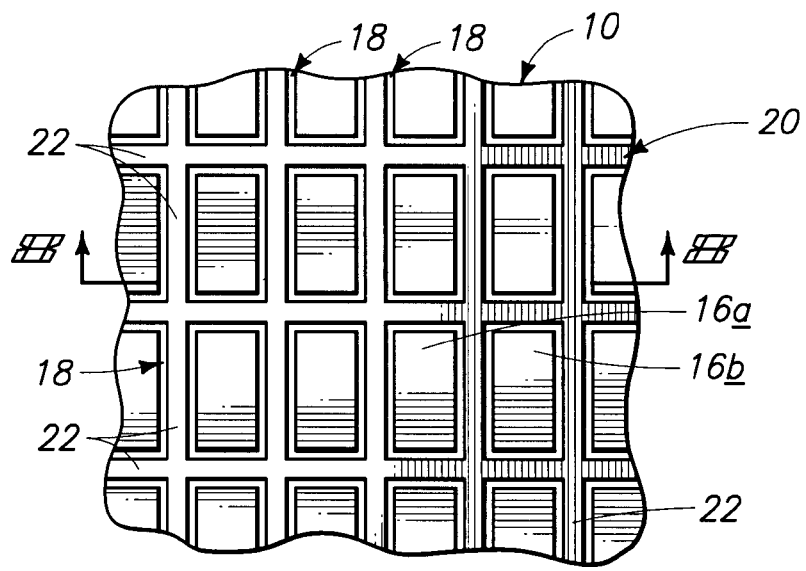
FIG. 4 is a top view of the FIG. 3 stencil received over a substrate prior to dicing in accordance with an aspect of the invention.
Figure 5:
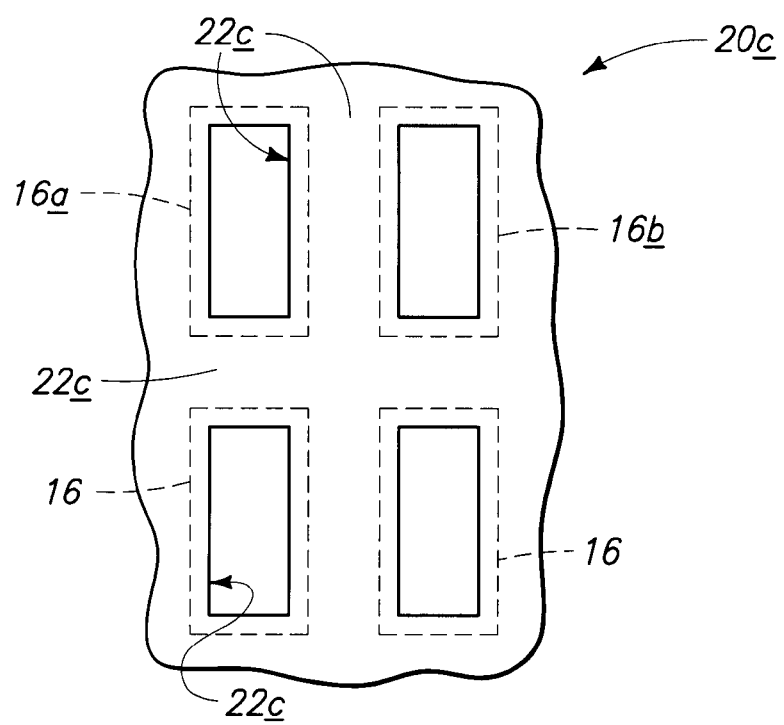
FIG. 5 is a further enlarged top view of a portion of an alternate stencil to that shown in FIG. 3 received over a substrate prior to dicing and usable in accordance with an aspect of the invention.
Figure 6:
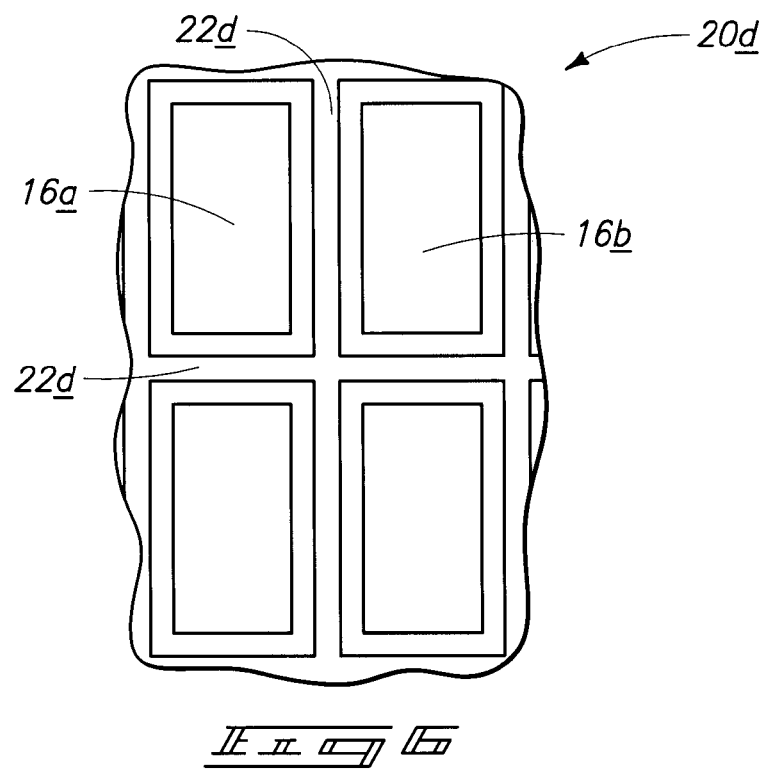
FIG. 6 is a top view of the FIG. 5 scale showing a portion of another alternate stencil to that shown in FIG. 3 received over a substrate prior to dicing and usable in accordance with an aspect of the invention.

Referring to FIGS. 3, 4, and 8 the invention employs a stencil 20. FIG. 3 depicts an exemplary stencil by itself, whereas FIGS. 4 and 8 depict an exemplary positioning of stencil 20 relative to substrate 10. Stencil 20 includes masking or covering sections 22 which cover at least portions of scribe line area 18. In one preferred embodiment, and as shown in FIGS. 4 and 8, masking sections 22 cover at least majority portions of the scribe line area between intermediately adjacent dice, for example dice 16a and 16b. FIG. 5 depicts an exemplary, alternate embodiment stencil 20c wherein masking sections 22c cover the entirety of the scribe line area between intermediately adjacent dice, for example between 16a and 16b. Alternately, of course, the depicted masking sections in FIG. 5 could also have dimensions which correspond to or exactly overlap or overlie with the edges of the respective dice. FIG. 6 depicts an exemplary alternate embodiment stencil 20d having masking sections 22d which cover less than majority portions of the scribe line area between immediately adjacent dice.

Figure 7:
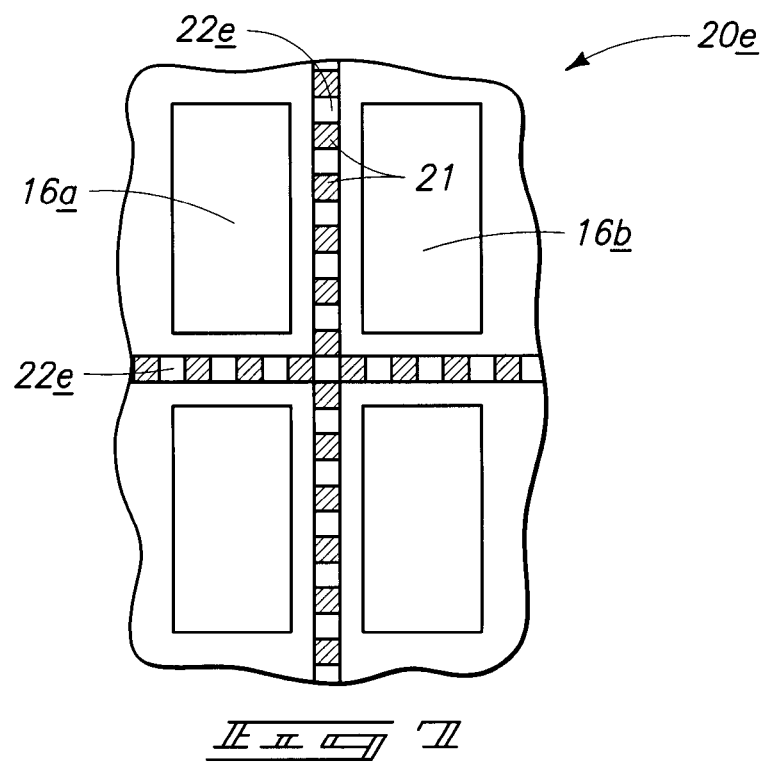
FIG. 7 is a top view of the FIG. 5 scale showing a portion of still another alternate stencil to that shown in FIG. 3 received over a substrate prior to dicing and usable in accordance with an aspect of the invention.
Figure 11:
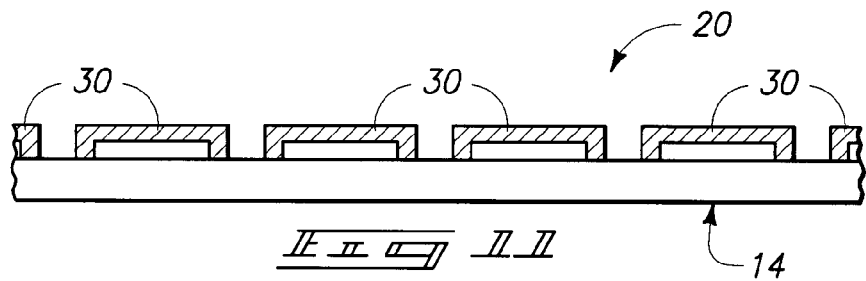
FIG. 11 is a view of the FIG. 9 substrate at a processing step subsequent to that shown by FIG. 9.

Each of the above-described exemplary stencil embodiments depict the masking sections as covering entirely continuous portions of the scribe line area between immediately adjacent dice, and is most preferred. Alternately by way of example only, FIG. 7 depicts an alternate embodiment stencil 20e wherein the masking sections are not entirely continuous within the scribe line area between immediately adjacent dice. Screen sections 21 interconnect individual sections 22e, with screened stencils or any other stencil technique, whether existing or yet-to-be developed, of course being contemplated.

FIG. 8 depicts the exemplary FIG. 4 stencil 20 positioned over first side 12 of substrate 10, with the stencil masking sections 22 covering at least portions of scribe line area 18.

Referring to FIGS. 9 and 10, a polymer 30 is applied through the positioned stencil onto first side 12 of substrate 10, with stencil 20 substantially precluding the polymer from being applied on the covered portions of scribe line area 18. By way of example only, exemplary polymers include silicones, polyimids, epoxies, etc. The polymer materials could include fillers, of course, such as silicates configured to reduce the thermal coefficient of expansion and adjust the viscosity of the polymer material. By way of example only, one suitable curable polymer is manufactured by Dexter Electronic Materials of Rocky Hill, Conn. under the trademark "HYSOL" FP4451. Regardless, the polymer can be applied by any suitable method, and preferably directed towards producing the exemplary FIGS. 9 and 10 embodiment.

Preferably, the polymer is allowed to cure either by the passage of time, heat exposure, radiation exposure or any other method or combination whether existing or yet-to-be developed. Then, the stencil is preferably removed by peeling it away, for example to leave the FIG. 11 construction. Further preferably, the process is repeated on second side 14 to produce the illustrated FIG. 12 construction. Alternately but less preferred, the polymer could, of course, be blanketly applied over second side 14, or deposited in any other manner or configuration. Regardless, the polymers deposited on the front and back sides might be the same or different in composition. Alternately by way of example only, polymer is not deposited on second side 14.

Regardless, cutting occurs into portions of the scribe line area and the plurality of dice are ultimately singulated from the substrate. The cutting can occur by any existing or yet-to-be developed methods, including scribing, sawing, water jet, laser, wet or dry etching, etc. Further, the dicing/cutting action itself as just so described might be less than completely through the substrate, or alternately be completely through the substrate effective to effect the dice singulating at the time of first cutting. Preferably by way of example only in connection with the problems which motivated the invention, such cutting is conducted with a mechanical saw which cuts completely through the substrate effective to effect the singulating. Further most preferably, the saw blade width and the stencil design and positioning are such that sawing can be conducted in a manner in which the saw never contacts any of the polymer, towards precluding any fouling of the saw with the polymer. Of course alternately, cutting could be any other method whether existing or yet to be developed, for example by laser application or cutting with a fluid, for example water.

Figure 13:
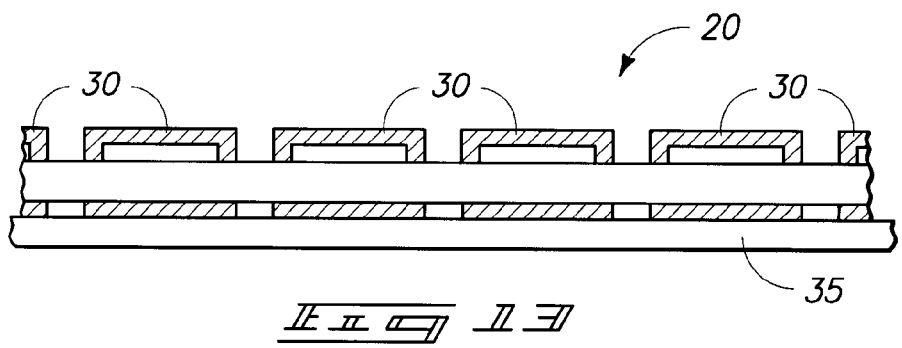
FIG. 13 is a view of the FIG. 12 substrate at a processing step subsequent to that shown by FIG. 12.
Figure 14:
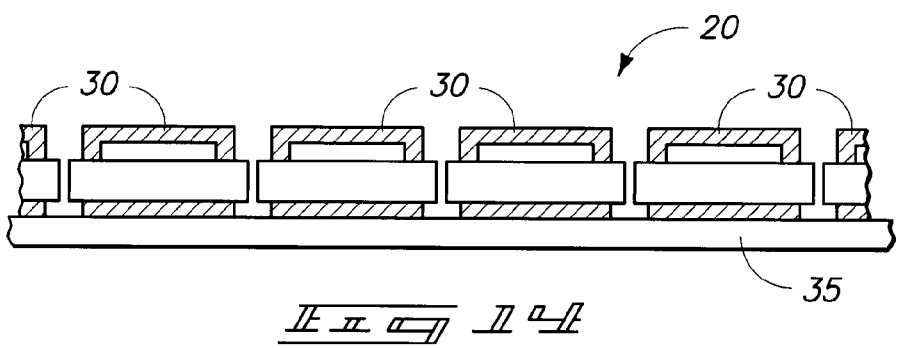
FIG. 14 is a view of the FIG. 13 substrate at a processing step subsequent to that shown by FIG. 13.

By way of example only, FIG. 13 depicts substrate 10 with polymer adhered to both sides of the substrate, but for the depicted scribe line areas 18, and adhered to some suitable backing tape 35 for sawing. The stencil is preferably removed prior to any sawing action, to avoid further wearing of the saw and destruction of the stencil such that it might be reused. An exemplary result is shown in FIG. 14. The described cutting might occur into the first side, into the second side or into both sides.

Figure 12:
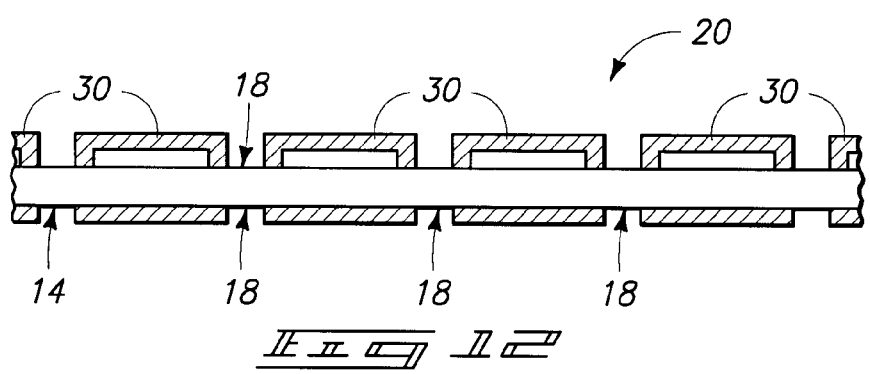
FIG. 12 is a view of the FIG. 11 substrate at a processing step subsequent to that shown by FIG. 11.
Figure 15:
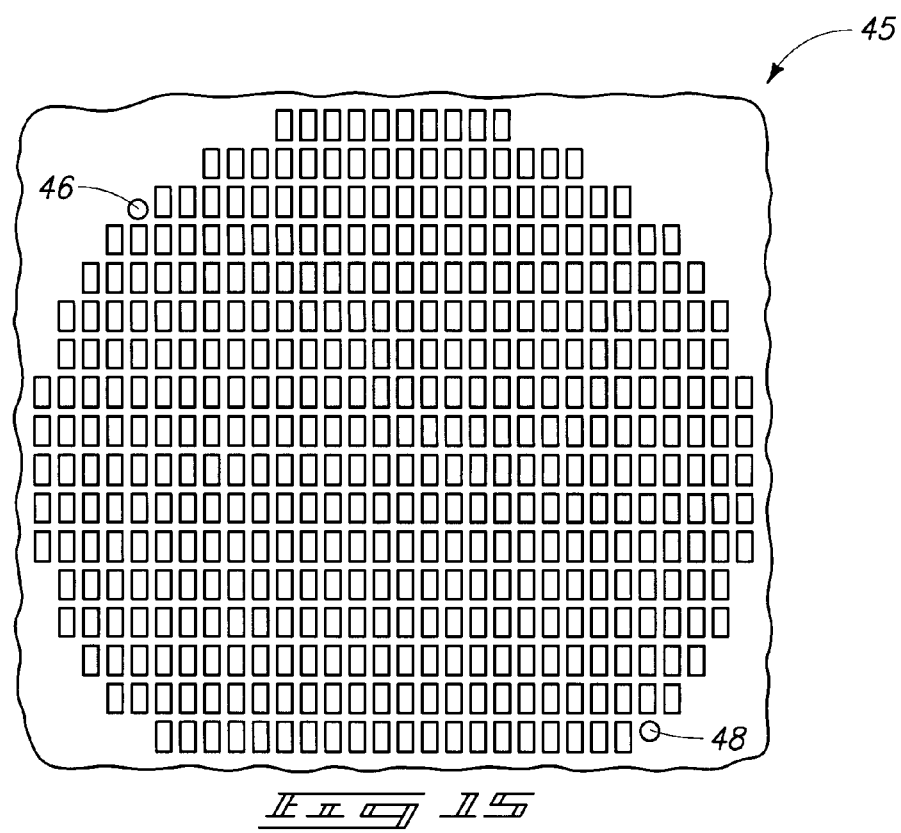
FIG. 15 is a top plan view of a stencil usable in accordance with an aspect of the invention.

Desired stencil positioning to produce the FIG. 12 construction may require careful positioning or aligning of the stencil with respect to each side of the substrate, of course. By way of example only and with respect to the side of a substrate having the dice visible thereon, the stencil can be positioned by any suitable visual means, i.e., with or without human intervention or perception. Such might also be accomplished relative to positioning of the same stencil onto the backside of the substrate. The invention in certain aspects also contemplates providing at least one alignment mark within the stencil. For example and by way of example only, FIG. 15 depicts an exemplary alternate stencil 45 having a pair of alignment markings 46 and 48 formed therein. At least two spaced alignment marks are preferred, as shown. Alternately but less preferred, a single continuous alignment mark could be utilized. Further, the respective illustrated alignment marks 46 and 48 could be in the form of a positive blocking area or a negative open area. Further preferably, and by way of example only, such alignment marks are typically formed over areas of the semiconductor wafer over which polymer may or may not be desired to be received, i.e., at the periphery of the wafer or over the scribe line area.

Regardless, stencil 45 can be utilized in the manner of stencil 20 of the first described embodiment in the application of polymer over a first or second side of the substrate initially. Accordingly, such will form at least one alignment mark in the applied polymer on the one side of the substrate from the at least one stencil alignment mark.

Figure 16:
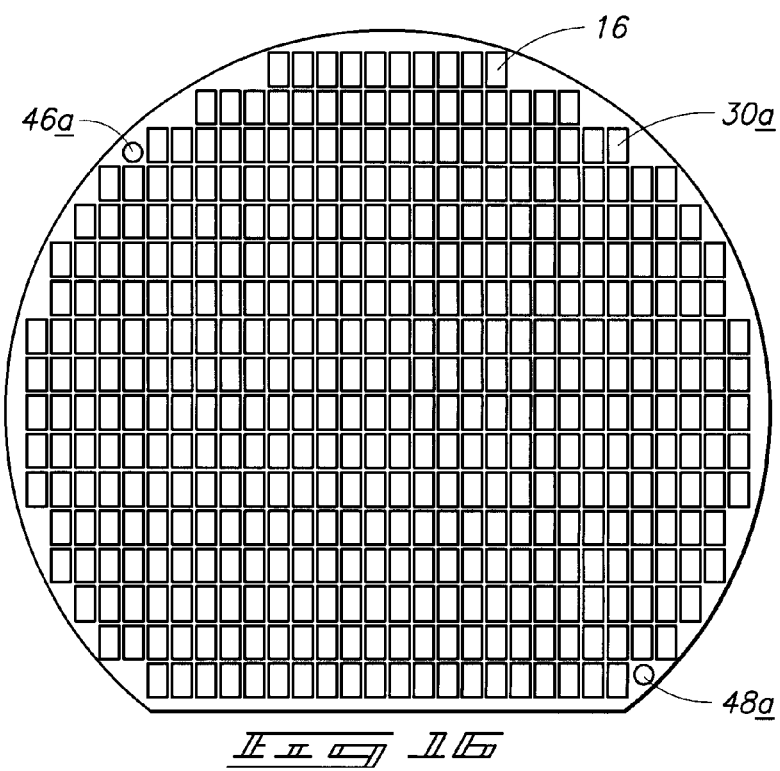
FIG. 16 is a top plan view of a substrate processed in accordance with an aspect of the invention using the FIG. 14 stencil.

By way of example only, FIG. 16 depicts stencil alignment marks 46a and 48a formed within a polymer layer 30a over a first side of the substrate. The polymer would then be allowed to cure, and the stencil positioned over the second side of the substrate in a manner that aligns any and all stencil alignment marks with all of the first side polymer alignment marks created over the substrate. Any suitable existing or yet-to-be developed means could be utilized for aligning the stencil alignment marks with the polymer alignment marks previously formed on the other side. For example and by way of example only, existing substrates are transmissive of infrared radiation/light. Accordingly the alignment markings 46a and 48a made on one side of the substrate will be perceptible through the substrate by passing infrared light through either side of the substrate for determining and achieving a desired proper alignment of the stencil on the side of the substrate opposite the one side. Alternately by way of example only, visible or other spectrum light might be utilized with mirrors, or a combination of mirrors and one or more cameras.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of fabricating semiconductor components, comprising:

provided a plurality of semiconductor dice on a substrate having a first side and a second side, the semiconductor dice being spaced from one another by scribe line area;

positioning a stencil over at least one of the first side and the second side of the substrate, the stencil comprising masking sections which cover at least portions of the scribe line area;

applying a polymer through the positioned stencil onto the first or second side of the substrate over which the stencil is received, with the stencil substantially precluding the polymer from being applied on the covered portions of the scribe line area; and after the applying, cutting into the portions of the scribe line area and singulating the plurality of dice from the substrate.

2. The method of claim 1 wherein the masking sections cover at least majority portions of the scribe line area between immediately adjacent dice.

3. The method of claim 1 wherein the masking sections cover less than majority portions of the scribe line area between immediately adjacent dice.

4. The method of claim 1 wherein the masking sections cover entirely continuous portions of scribe line area between immediately adjacent dice.

5. The method of claim 1 wherein the masking sections cover an entirety of the scribe line area between immediately adjacent dice.

6. The method of claim 1 wherein the cutting is less than completely through the substrate.

7. The method of claim 1 wherein the cutting is completely through the substrate effective to effect said singulating.

8. The method of claim 1 wherein the cutting comprises sawing with a mechanical saw.

9. The method of claim 8 wherein the saw never contacts the polymer.

10. The method of claim 1 wherein the cutting comprises sawing with a mechanical saw completely through the substrate effective to effect said singulating.

11. The method of claim 10 wherein the saw never contacts the polymer.

12. The method of claim 1 wherein the cutting comprises using a laser.

13. The method of claim 1 wherein the cutting comprises using a fluid stream.

14. The method of claim 1 comprising removing the stencil prior to the sawing.

15. The method of claim 1 comprising after the applying and before the cutting, applying a polymer to the other of the first side and the second side of the substrate.

16. The method of claim 1 comprising after the applying and before the cutting, positioning the stencil on the other of the first side and the second side with the stencil masking sections covering at least portions of the scribe line area, and applying a polymer through the other-side positioned stencil onto the other side of the substrate over which the stencil is received, with the stencil substantially precluding the polymer from being applied on the covered portions of the other side scribe line area.

17. A method of fabricating semiconductor components, comprising:
  providing a plurality of semiconductor dice on a substrate having a first side and a second side, the semiconductor dice being spaced from one another by scribe line area;
  positioning a stencil over at least one of the first side and the second side of the substrate, the stencil comprising masking sections which cover entirely continuous portions of the scribe line areas between immediately adjacent dice;
  applying a polymer through the positioned stencil onto the first or second side of the substrate over which the stencil is received, with the stencil substantially precluding the polymer from being applied on the covered portions of the scribe line area;
  after the applying, removing the stencil; and
  after removing the stencil, cutting into the portions of the scribe line area with a mechanical saw and singulating the plurality of dice from the substrate, the saw never contacting said polymer.

18. The method of claim 17 wherein the masking sections cover at least majority portions of the scribe line area between immediately adjacent dice.

19. The method of claim 17 wherein the masking sections cover less than majority portions of the scribe line area between immediately adjacent dice.

20. The method of claim 17 wherein the masking sections cover an entirety of the scribe line area between immediately adjacent dice.

21. The method of claim 17 wherein the cutting is less than completely through the substrate.

22. The method of claim 17 wherein the cutting is completely through the substrate effective to effect said singulating.

23. The method of claim 17 comprising after the applying and before the cutting, applying a polymer to the other of the first side and the second side of the substrate.

24. The method of claim 17 comprising after the applying and before the cutting, positioning the stencil on the other of the first side and the second side with the stencil masking sections covering at least portions of the scribe line area, and applying a polymer through the other-side positioned stencil onto the other side of the substrate over which the stencil is received, with the stencil substantially precluding the polymer from being applied on the covered portions of the other side scribe line area.

25. A method of fabricating semiconductor components, comprising:
  providing a plurality of semiconductor dice on a substrate having a first side and a second side, the semiconductor dice being spaced from one another by scribe line area;
  positioning a stencil over the first side of the substrate, the stencil comprising masking sections which cover at least portions of the scribe line area, the stencil comprising at least one alignment mark;
  applying a polymer through the first-side positioned stencil onto the first side of the substrate, with the stencil substantially precluding the polymer from being applied on the covered portions of the scribe line area on the first side, and forming at least one alignment mark in the first side polymer with the at least one stencil alignment mark;
  after applying the polymer onto the first side of the substrate, positioning the stencil over the second side of the substrate in a manner that aligns all stencil alignment marks with all first side polymer alignment marks;
  applying a polymer through the second-side positioned stencil onto the second side of the substrate, with the stencil substantially precluding the polymer from being applied on the covered portions of the scribe line area on the second side; and
  after applying the polymer onto the second side of the substrate, removing the stencil from the second side and cutting into the portions of the scribe line area and singulating the plurality of dice from the substrate.

26. The method of claim 25 wherein the stencil comprises at least two spaced alignment marks and forms at least two spaced alignment marks in the first side polymer.

27. The method of claim 25 wherein the polymer applied on the front side and the polymer applied on the back side have a composition common to both.

28. The method of claim 25 wherein the polymer applied on the front side and the polymer applied on the back side have different compositions.

29. The method of claim 25 wherein the cutting occurs into the first side.

30. The method of claim 25 wherein the cutting occurs into the second side.

31. The method of claim 25 wherein the stencil positioning and aligning over the second side comprises infrared light.

32. The method of claim 25 wherein the stencil positioning and aligning over the second side comprises use of at least one mirror.

33. The method of claim 25 wherein the masking sections cover at least majority portions of the scribe line area between immediately adjacent dice.

34. The method of claim 25 wherein the masking sections cover less than majority portions of the scribe line area between immediately adjacent dice.

35. The method of claim 25 wherein the masking sections cover entirely continuous portions of scribe line area between immediately adjacent dice.

36. The method of claim 25 wherein the masking sections cover an entirety of the scribe line area between immediately adjacent dice.

37. The method of claim 25 wherein the cutting is less than completely through the substrate.

38. The method of claim 25 wherein the cutting is completely through the substrate effective to effect said singulating.

39. The method of claim 25 wherein the cutting comprises sawing with a mechanical saw.

40. The method of claim 39 wherein the saw never contacts any of the polymer on the first side or any of the polymer on the second side.

41. The method of claim 25 wherein the cutting comprises using a laser.

42. The method of claim 25 wherein the cutting comprises using a fluid stream.

43. The method of claim 25 wherein the cutting comprises sawing with a mechanical saw completely through the substrate effective to effect said singulating.

44. The method of claim 43 wherein the saw never contacts any of the polymer on the first side or any of the polymer on the second side.

* * * * *